US012253556B2

(12) United States Patent
Chen et al.

(10) Patent No.: US 12,253,556 B2
(45) Date of Patent: Mar. 18, 2025

(54) DEVICES AND METHODS FOR ARCING DETECTION

(71) Applicant: SHANGHAI UNITED IMAGING HEALTHCARE CO., LTD., Shanghai (CN)

(72) Inventors: Siming Chen, Shanghai (CN); Guoping Zhu, Shanghai (CN); Jinglin Wu, Shanghai (CN); Biao Luo, Shanghai (CN); Xu Chu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 18/317,907

(22) Filed: May 15, 2023

(65) Prior Publication Data

US 2023/0280390 A1 Sep. 7, 2023

Related U.S. Application Data

(63) Continuation of application No. 17/305,538, filed on Jul. 9, 2021, now Pat. No. 11,650,242.

(30) Foreign Application Priority Data

Jul. 9, 2020 (CN) .......................... 202010656446.5

(51) Int. Cl.
*G01R 31/14* (2006.01)
*G01R 15/18* (2006.01)
(Continued)

(52) U.S. Cl.
CPC ............ *G01R 31/14* (2013.01); *G01R 15/181* (2013.01); *G01R 19/0092* (2013.01); *H01J 35/02* (2013.01)

(58) Field of Classification Search
CPC .. G01R 31/14; G01R 15/181; G01R 19/0092; H01J 35/02
See application file for complete search history.

(56) References Cited

U.S. PATENT DOCUMENTS 5,185,684 A 2/1993 Beihoff et al.
5,208,542 A 5/1993 Tennies et al.
(Continued)

FOREIGN PATENT DOCUMENTS

CA 2813933 A1 11/2013
CN 105182163 A 12/2015
(Continued)

OTHER PUBLICATIONS

The Extended European Search Report in European Application No. 21184917.9 mailed on Dec. 2, 2021, 9 pages.
(Continued)

*Primary Examiner* — Dominic E Hawkins
(74) *Attorney, Agent, or Firm* — METIS IP LLC

(57) ABSTRACT

The present disclosure provides an arcing detection device. The arcing detection device may include a detection coil and a processing circuit operably connected to the detection coil. The detection coil may be configured to detect a current variation of a system. The processing circuit may be configured to determine information of an arcing event of the system based on the current variation of the system. The information of the arcing event of the system may include a position where the arcing event occurs in the system.

20 Claims, 9 Drawing Sheets

(51) Int. Cl.
*G01R 19/00* (2006.01)
*H01J 35/02* (2006.01)

(56) References Cited

U.S. PATENT DOCUMENTS

| | | | |
|---|---|---|---|
| 5,347,571 | A | 9/1994 | Furbee et al. |
| 5,682,101 | A | 10/1997 | Brooks et al. |
| 5,939,876 | A | 8/1999 | Füglister et al. |
| 6,242,993 | B1 | 6/2001 | Fleege et al. |
| 6,975,698 | B2 | 12/2005 | Katcha et al. |
| 10,788,542 | B2 | 9/2020 | Minich et al. |
| 2010/0259275 | A1 | 10/2010 | Grieshaber et al. |
| 2014/0273571 | A1 | 9/2014 | Iyer et al. |
| 2015/0055750 | A1* | 2/2015 | Takahashi .......... H01J 35/025 378/104 |
| 2016/0027606 | A1 | 1/2016 | Barthel |
| 2017/0184458 | A1* | 6/2017 | Jefferies ............. G01R 31/62 |
| 2017/0343597 | A1 | 11/2017 | Meyer et al. |
| 2018/0083436 | A1 | 3/2018 | Chen et al. |
| 2018/0166833 | A1 | 6/2018 | Nie et al. |
| 2018/0166874 | A1* | 6/2018 | Beierschmitt ....... H02H 1/0046 |
| 2018/0263100 | A1* | 9/2018 | Gebert ............... H05G 1/265 |
| 2019/0094329 | A1 | 3/2019 | Minich |
| 2019/0207375 | A1 | 7/2019 | Telefus et al. |
| 2019/0222017 | A1* | 7/2019 | Miller, III ........... A61G 12/005 |
| 2019/0227105 | A1 | 7/2019 | Minich et al. |
| 2019/0386479 | A1 | 12/2019 | Packard |
| 2020/0321767 | A1 | 10/2020 | Meyer et al. |
| 2020/0321768 | A1 | 10/2020 | Schegner et al. |

FOREIGN PATENT DOCUMENTS

| | | |
|---|---|---|
| CN | 106054009 A | 10/2016 |
| CN | 106655084 A | 5/2017 |
| CN | 109688685 A | 4/2019 |
| CN | 110308370 A | 10/2019 |
| CN | 110912390 A | 3/2020 |
| CN | 111077424 A | 4/2020 |
| EP | 3306813 B1 | 5/2022 |
| JP | H0568370 A | 3/1993 |
| KR | 20150024773 A | 3/2015 |

OTHER PUBLICATIONS

First Office Action in Chinese Application No. 202010656446.5 mailed on Oct. 25, 2022, 19 pages.

"Principle of X-ray machine", Web page <https://wenku.baidu.com/view/94ed3af9af1ffc4fff47ac62.html>, 2015,112 pages.

Gong, Yongzhen, Research Overview of Rogowski Coil Current Sensing Technology, Guangxi Journal of Light Industry, 2011, 4 pages.

Chae, Suyong et al., Series DC Arc Fault Detection Algorithm for DC Microgrids Using Relative Magnitude Comparison, IEEE Journal of Emerging and Selected Topics in Power Electronics, 4(4): 1270-1278, 2016.

Li, Yan et al., Research Progress of Online Detection of EDM Spark Location, Electromachining &Mould, 1996, 5 pages.

* cited by examiner

900

| 910 |
|---|
| Obtaining a signal associated with a first current variation of a system |

↓

| 920 |
|---|
| Determining a second current variation of the system based on the signal associated with the first current variation rate |

↓

| 930 |
|---|
| Determining information of an arcing event of the system based on the second current variation rate of the system, the information of the arcing event of the system comprising a position where an electric spark occurs in the system |

FIG. 9

DEVICES AND METHODS FOR ARCING DETECTION

CROSS-REFERENCE TO RELATED APPLICATIONS

This application is a continuation of U.S. patent application Ser. No. 17/305,538, filed on Jul. 9, 2021, which claims priority to Chinese Patent Application No. 202010656446.5, filed on Jul. 9, 2020, the contents of which are hereby incorporated by reference.

TECHNICAL FIELD

The present disclosure generally relates to arcing detection, and more particularly, relates to an arcing detection device and an arcing detection method thereof.

BACKGROUND

When a system operates involving a high-voltage power, an arcing event may occur in the system. During the arcing event, an impedance of the system may drop abruptly and correspondingly an electric current of the system may increase abruptly, negatively affecting the performance of the system and/or reducing a service life of the system. Thus, it is desirable to design an arcing detection device configured to efficiently detect, e.g., whether an arcing event (e.g., a small arcing event, a big arcing event) occurs in a system, a position where an arcing event occurs in the system etc.

SUMMARY

According to some embodiments of the present disclosure, an arcing detection device may be provided. The arcing detection device may include a detection coil configured to detect a current variation of a system; and a processing circuit operably connected to the detection coil. The processing circuit may be configured to determine information of an arcing event of the system based on the current variation of the system. The information of the arcing event of the system may include a position where the arcing event occurs in the system.

In some embodiments, the information of the arcing event may also include whether the arcing event of the system is a small arcing event or a big arcing event.

In some embodiments, the detection coil may include a winding material and a framework configured to support the winding material.

In some embodiments, the winding material may include a winding wire or a winding laying.

In some embodiments, the winding material may be wound, by multiple turns, from a first position of the framework to a second position of the framework.

In some embodiments, the winding material may also be wound, on a central region of the framework, from the second position to the first position along a circumferential direction of the framework.

In some embodiments, the detection coil may include a Rogowski coil.

In some embodiments, the Rogowski coil may be integrated in a printed circuit board (PCB).

In some embodiments, the processing circuit may include a comparison circuit configured to: generate a comparison result by comparing the current variation of the system with one or more current variation thresholds; and determine the information of the arcing event of the system based on the comparison result.

In some embodiments, the comparison circuit may include a first comparator of a first current variation threshold and a second comparator of a second current variation threshold. The first comparator and the second comparator may be configured to compare the current variation with the first current variation threshold and the second current variation threshold, respectively. The first current variation threshold may be lower than the second current variation threshold. In response to determining that the current variation is higher than the first current variation threshold and lower than the second current variation threshold, the comparison circuit may determine that the small arcing event occurs in the system. In response to determining that the current variation is higher than the second current variation threshold, the comparison circuit may determine that the big arcing event occurs in the system.

In some embodiments, the processing circuit may include a transformer, a first end of which is operably connected to the detection coil, and a second end of which is operably connected to the comparison circuit. The transformer may be configured to insulate a signal associated with the current variation from a magnetic field generated by the arcing event of the system and transmit the signal to the comparison circuit.

In some embodiments, the arcing detection device may also include a casing configured to accommodate the detection coil.

In some embodiments, the detection coil may be operably connected to a high-voltage connection assembly configured to operably connect the detection coil to the system. The high-voltage connection assembly may include at least one of a plug, a socket, or a flange.

In some embodiments, the plug may be operably connected to the flange; the plug may match with the socket; and the plug may be located in the detection coil.

In some embodiments, the detection coil may be integrated in the plug.

In some embodiments, the system may include an X-ray system. The X-ray system may include: an X-ray tube configured to emit an X-ray beam; a high-voltage tank configured to generate a high voltage. The high voltage may be applied to the X-ray tube to provide power to the X-ray tube. The detection coil may be located between the high-voltage tank and the X-ray tube.

In some embodiments, the high-voltage tank may include a high-voltage connection assembly configured to operably connecting the detection coil to the X-ray system. In response to determining that the arcing event occurs in the system based on the current variation detected by the detection coil, the arcing event may be determined to occur in the X-ray tube or a high-voltage cable operably connecting the high-voltage tank and the X-ray tube.

In some embodiments, the X-ray tube may include a high-voltage connection assembly configured to operably connecting the detection coil to the X-ray system. In response to determining that the arcing event occurs in the system based on the current variation detected by the detection coil, the arcing event may be determined to occur in the X-ray tube.

In some embodiments, the detection coil may include a first detection coil located at a high-voltage connection assembly of the high-voltage tank and a second detection coil located at a high-voltage connection assembly of the X-ray tube. In response to determining that the arcing event occurs in the system based on a current variation detected by the first detection coil and no arcing event occurs in the system based on a current variation detected by the second detection coil, the arcing event may be determined to occur in a high-voltage cable that operably connects the high-voltage tank and the X-ray tube.

In some embodiments, the detection coil may include a first detection coil located at a high-voltage connection assembly of the high-voltage tank and a second detection coil located at lead of an arcing suppression unit of the high-voltage tank. In response to determining that the arcing event occurs in the system based on a current variation detected by the second detection coil and no arcing event occurs in the system based on a current variation detected by the first detection coil, the arcing event may be determined to occur in the high-voltage connection assembly of the high-voltage tank.

In some embodiments, the detection coil may include a first detection coil located at a lead of an arcing suppression unit of the high-voltage tank and a second detection coil located at a lead of a filter capacitor of the high-voltage tank. In response to determining that the arcing event occurs in the system based on a current variation detected by the second detection coil and no arcing event occurs in the system based on a current variation detected by the first detection coil, the arcing event may be determined to occur in the arcing suppression unit of the high-voltage tank.

In some embodiments, in response to determining that an electric current detected by a current detection unit of the high-voltage tank is larger than a first current threshold and smaller than a second current threshold, the arcing event may be determined to occur in a high-voltage connection assembly of the high-voltage tank.

According to another aspect of the present disclosure, a detection coil configured to detect a current variation of a system may be provided. The detection coil may include: a winding material; and a framework configured to support the winding material. The winding material may be wound, by multiple turns, from a first position of the framework to a second position of the framework and further wound, on a central region of the framework, from the second position to the first position along a circumferential direction of the framework.

According to another aspect of the present disclosure, a high-voltage connection assembly configured to operably connect at least two components may be provided. The high-voltage connection assembly may include: a plug operably connected to a flange; a socket matching with the plug; and a detection coil integrated in the plug. The detection coil may be configured to detect a current variation of a system.

According to another aspect of the present disclosure, an arcing detection method may be provided. The arcing detection method may include: obtaining a signal associated with a first current variation of a system; determining a second current variation of the system based on the signal associated with the first current variation; and determining information of an arcing event of the system based on the second current variation of the system, the information of the arcing event of the system comprising a position where an arcing event occurs in the system.

In some embodiments, the signal associated with the first current variation or the second variation may be detected by a detection coil of an arcing detection device. The system may include a high-voltage tank, an X-ray tube, and a high-voltage cable operably connecting the high-voltage tank to the X-ray tube. The high-voltage tank may include a high-voltage connection assembly configured to operably connecting the detection coil to the system. In response to determining that the arcing event occurs in the system is determined based on the current variation detected by the detection coil, the arcing event may be determined to occur in the X-ray tube or the high-voltage cable.

In some embodiments, in response to determining that the second current variation is higher than a first current variation threshold, the arcing event occurs in the system may be determined.

In some embodiments, the information of the arcing event of the system may also include whether the arcing event of the system is a small arcing event or a big arcing event.

In some embodiments, in response to determining that the second current variation is higher than a first current variation threshold and lower than a second current variation threshold, the arcing event of the system is a small arcing event may be determined.

In some embodiments, in response to determining that the current variation is higher than a second current variation threshold, the arcing event of the system is a big arcing event may be determined.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 9 is a flowchart illustrating an exemplary arcing detection process according to some embodiments of the present disclosure;

DETAILED DESCRIPTION

Figure 1A:
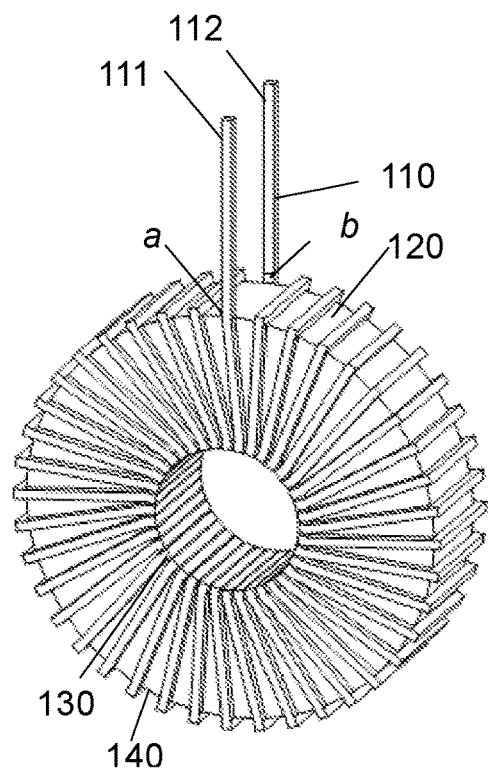
FIGS. 1A and 1B provide different views illustrating an exemplary detection coil according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that the terms "system," "device," "assembly," "component," etc., when used in this disclosure, refer to one or more parts with one or more specific purposes. However, a structure that may perform a same or similar function compared to a part exemplified above or referred to elsewhere in the present disclosure may be named differently from the present disclosure.

In the present disclosure, spatial reference terms such as "center," "longitudinal," "transverse," "length," "width," "thickness," "upper," "lower," "front," "back," "left," "right," "vertical," "horizontal," "top," "bottom," "inner," "outer," "clockwise," "counterclockwise," "axial," "radial," "circumferential," etc., indicate, in a relative sense, an orientation or positional relationship between two or more elements, assemblies, devices, or systems based on an orientation or positional relationship as shown in the drawings, and are only for the convenience and simplicity of description, rather than indicating or implying that the elements, assemblies, devices or systems in the present disclosure have a particular orientation when the disclosed system, or a portion thereof, is in operation, or are constructed and operated in a particular orientation, and therefore may be not understood as a limitation of the present disclosure.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention.

In the present disclosure, unless otherwise clearly specified and limited, the terms "mount," "connect," "couple," "fix," "locate," "dispose," etc., should be understood in a broad sense, for example, it may be a fixed connection, a detachable connection, integrated into a whole, a mechanical connection, an electrical connection, directly connected, or indirectly connected via an intermediate medium, an internal connection of two elements, or an interconnection of two elements, unless otherwise clearly defined. For those skilled in the art, the specific meanings of the above terms in the present disclosure may be understood according to specific circumstances.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

According to some embodiments of the present disclosure, an arcing detection device may be provided. The arcing detection device may include a detection coil and a processing circuit operably connected to the detection coil. The detection coil may be configured to detect a current variation (e.g., a current ramp (also referred to as a current variation rate) of a system. The processing circuit may be configured to determine information of an arcing event of the system based on the current variation (e.g., a current ramp) of the system. For example, the information of the arcing event of the system may include whether an arcing event occurs in the system, a position where an arcing event occurs in the system, whether an arcing event of the system is a small arcing event or a big arcing event, or the like, or any combination thereof.

In some embodiments, if the current variation (e.g., a current ramp) is higher than a first current variation threshold, the arcing event may be determined to occur in the system. If the current variation (e.g., a current ramp) is lower than a second current variation threshold and higher than the first current variation threshold, the arcing event in the system may be determined to be a small arcing event. If the current variation (e.g., a current ramp) is higher than the second current variation threshold, the arcing event in the system may be determined to be a big arcing event.

In an existing system, a current variation (e.g., a current ramp) of the existing system may be first determined, and then an electric current of the existing system may be determined by performing massive filtering operations (e.g., an integration operation) on the current variation (e.g., a current ramp). Further, the detection of an arcing event (e.g., the small arcing event, the big arcing event) by the existing system may be based on the electric current, which may be time-consuming. Conversely, the system according to some embodiments of the present disclosure may directly utilize the current variation (e.g., a current ramp) to perform the arcing detection without performing the integration operations, thereby expediting the arcing detection process.

In some embodiments, if a small arcing event occurs in the system, the system can function normally; if a big arcing event occurs in the system, the system may be damaged by the big arcing event, and need to be shut down. Thus, by determining whether an arcing event is a small arcing event or a big arcing event, the system may be appropriately operated in response to the arcing event, thereby not only improving the operation efficiency of the system but also preventing damages to the system.

In some embodiments, the detection coil may include a winding material (e.g., a winding wire, a winding laying) and a framework configured to support the winding material. A first portion of the winding material may be wound along the framework by multiple turns, and a second portion of the winding material may be wound on a central region of the framework along a circumferential direction of the framework (e.g., shown in FIGS. 2A, 2B, 4A, or 4B). In an existing system, a coupling of an external magnetic field with a detection coil of the existing system may occur, which, in turn, may negatively affect an arcing detection. In some embodiments, the external magnetic field may be caused at least in part by an arcing event that occurs in the existing system, which may generate an electromagnetic interference signal. Additionally or alternatively, the electromagnetic interference signal may be caused due to a complex external electromagnetic environment in which the existing system, or the detector coil of the existing system, is subjected to. The coupling indicates that the electromagnetic interference signal is detected by the existing detection coil, thereby causing the signal detected by the detection coil to have noise, such as spikes, which in turn may reduce the accuracy of the arcing detection performed on the basis of the signal. For example, the electromagnetic interference signal may cause the system to mistakenly determine that an arcing event has occurred and mistakenly trigger an alarm in response to the false arcing event. According to some embodiments of the present disclosure, by setting the second portion of the winding material, such a coupling of an external magnetic field (e.g., a magnetic field generated by an arcing event of the system, a magnetic field in an environment where the system, or the detection coil of the system, is located) with the detection coil may be decoupled by the existence of the second portion of the winding material; accordingly, the accuracy of (a signal associated with) the current variation (e.g., a current ramp) detected by the detection coil may be improved, which in turn may improve the accuracy of the arcing detection.

In some embodiments, the processing circuit or the detection coil may process the current variation (e.g., a current ramp) of the system, and then determine the arcing event based on the processed current variation. For example, the processing circuit may process the current variation by performing a noise reduction on a signal associated with the current variation including reducing noise in the signal. In some embodiments, the current variation and/or the processed current variation may be insulated from external interference by, e.g., setting the second portion of the winding material, increasing an area of the framework covered by the winding material utilizing the winding laying, setting a transformer in the processing circuit, accommodating the detection coil in a casing that is electrically connected to ground or earth, etc., thereby increasing an accuracy of the current variation detection, reducing a computation burden of the processing of the current variation, and further increasing the speed of the arcing detection. Thus, an arcing event of the system may be predicted in a timely fashion at an early stage or at the beginning of the arcing event, thereby avoiding a damage to the system by the occurrence of an arcing event. Compared to the existing system in which an arcing event is detected at a late stage of the arcing event, the detection of an arcing event using an arcing detection device according to some embodiments of the present disclosure may be made at an early stage of the arcing event, regardless of whether the descriptions are provided using a present tense. For instance, the expression of "determination of whether an arcing event occurs," "determination of where an arcing event occurs," etc., does not suggest that the arcing event is happening, unless otherwise stated. As used herein, an early stage of an arcing event indicates that the time that has lapsed since the onset of the arcing event is shorter than a threshold, e.g., 30 seconds, 20 seconds, 10 seconds, 5 seconds, etc., or that the promulgation of the effect of the arcing event within the system is limited to a certain degree without causing damages to the system yet. As used herein, a late stage of an arcing event indicates that the time that has lapsed since the onset of the arcing event exceeds a threshold, e.g., 60 seconds, 50 seconds, 40 seconds, etc., or that the promulgation of the effect of the arcing event is beyond a certain portion of the system and may have caused damages to the system.

In some embodiments, the arcing detection device may be operably connected to the system through a high-voltage connection assembly (including, e.g., a plug, a socket, a flange). In some embodiments, at least a portion (e.g., the detection coil) of the arcing detection device may be integrated in the high-voltage connection assembly in advance (in terms of time), e.g., while the high-voltage connection assembly is manufactured, thereby simplifying the assembly of the arcing detection device in the system.

In some embodiments, the system may include an X-ray system. By arranging the detection coil in different positions of the X-ray system, the position of the arcing event in the X-ray system may be determined, which may be more convenient and in advance (at an early stage of the arcing event) than an existing X-ray system that needs to be disassembled to determine a position of an arcing event therein after the arcing event has already occurred. For example, the X-ray system may include a high-voltage connection assembly which is located at a wall (e.g., position c in FIG. 8A) of a high-voltage tank of the X-ray system. The high-voltage connection assembly may be configured to operably connect at least a portion (e.g., the detection coil) of the arcing detection device to the X-ray system. If an arcing event is determined to occur in the X-ray system based on the current variation (e.g., a current ramp) detected by the detection coil, it may be further determined where the arcing event occurs in the X-ray system, e.g., in the X-ray tube or a high-voltage cable operably connecting the high-voltage tank (e.g., the high-voltage connection assembly thereof) to the X-ray tube.

Figure 1B:
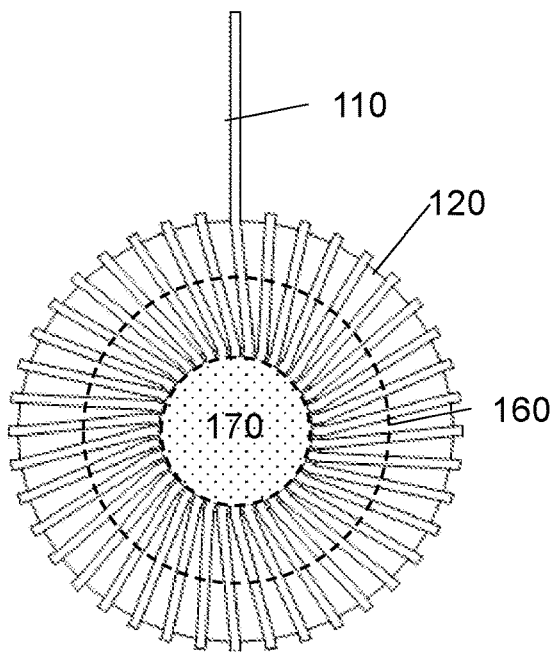
Figure 2A:
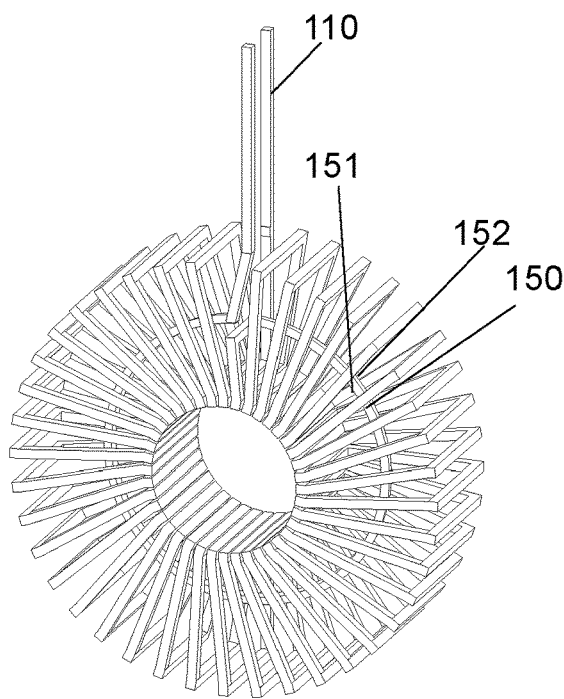
FIGS. 2A and 2B provide different views illustrating an exemplary detection coil according to some embodiments of the present disclosure.
Figure 2B:
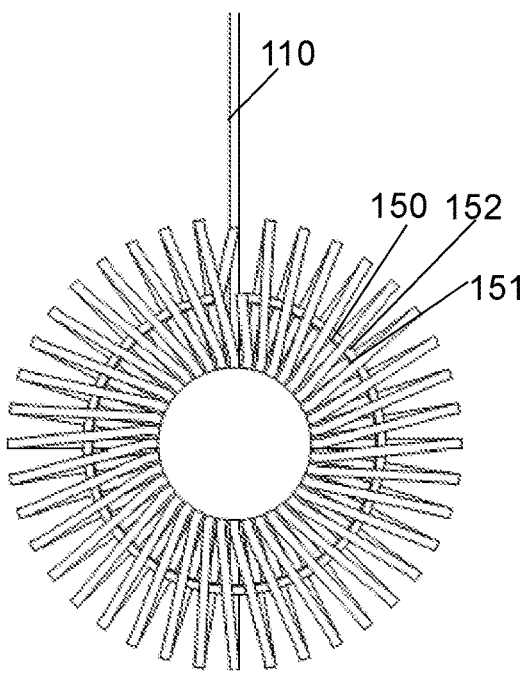
Figure 3A:
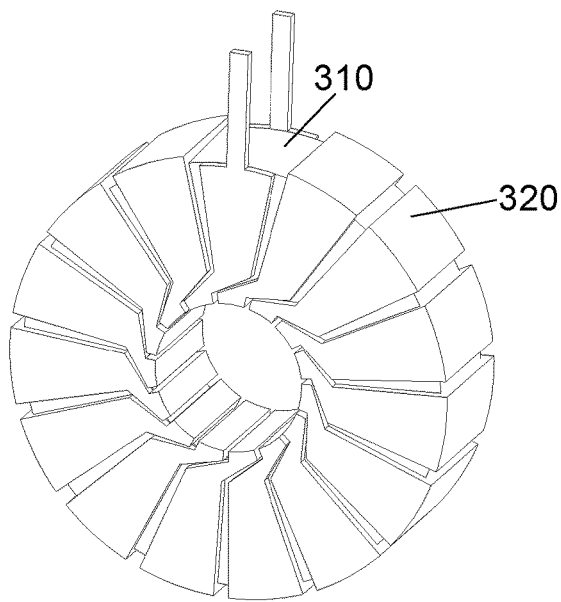
FIGS. 3A and 3B provide different views illustrating an exemplary detection coil according to some embodiments of the present disclosure.
Figure 3B:
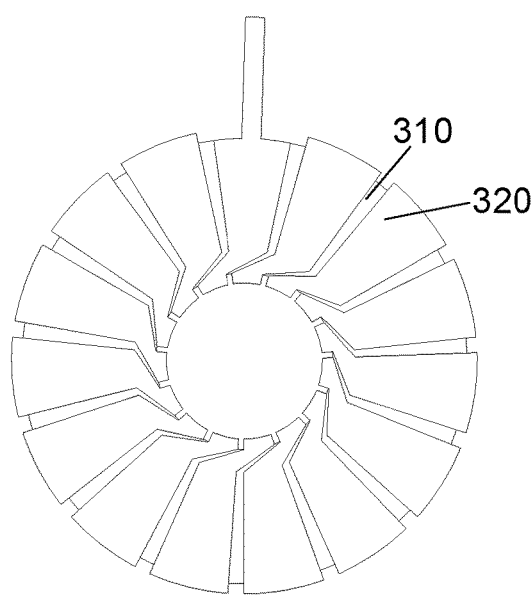
Figure 4A:
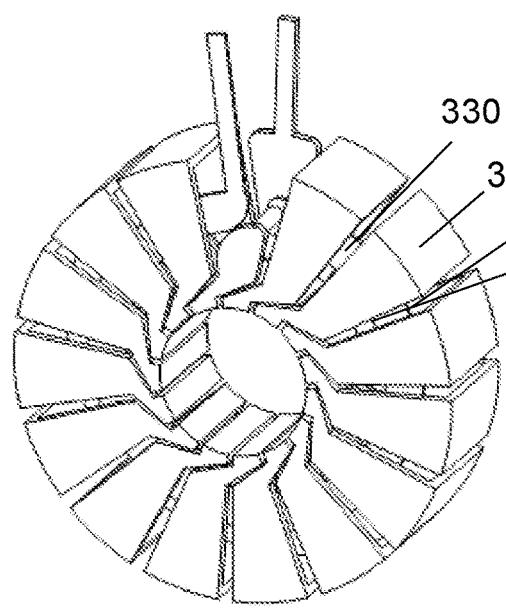
FIGS. 4A and 4B provide different views illustrating an exemplary detection coil according to some embodiments of the present disclosure.
Figure 4B:
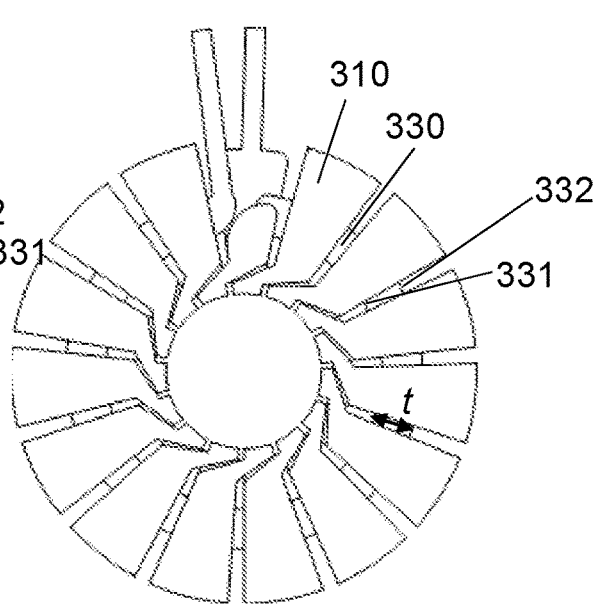
Figure 5:
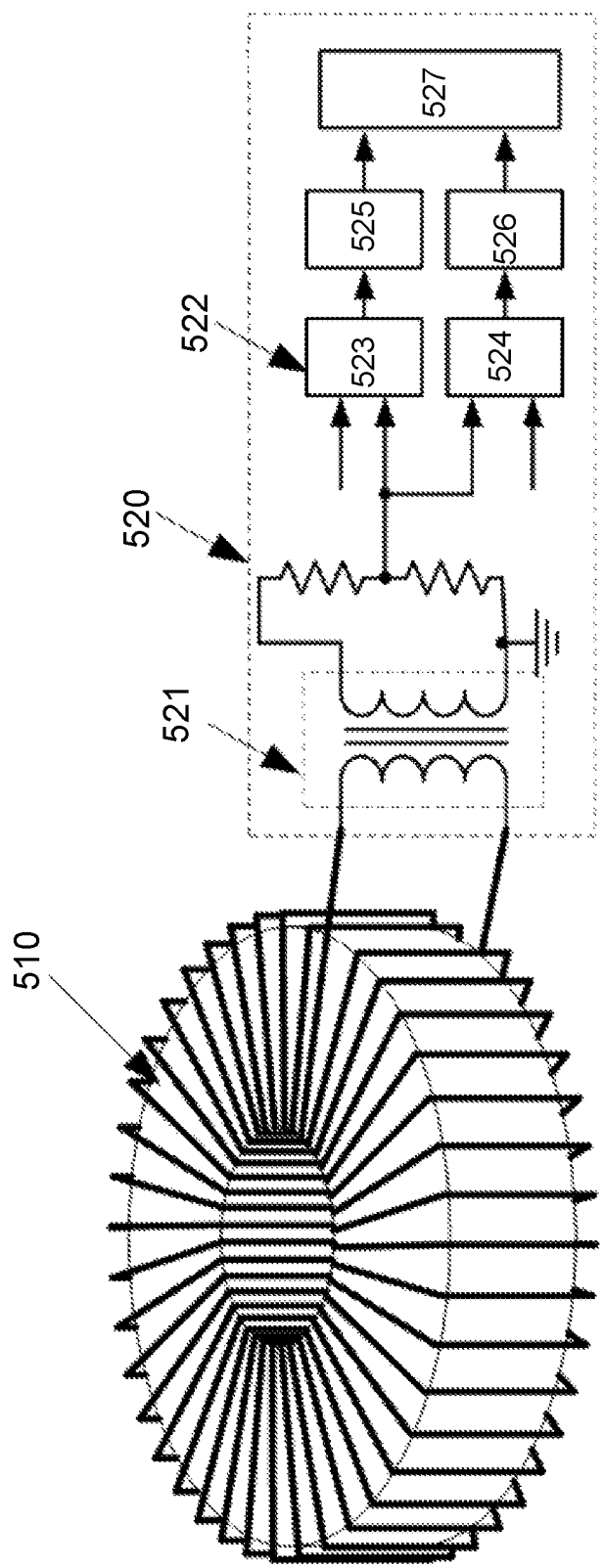
FIG. 5 is a schematic diagram illustrating an exemplary arcing detection device according to some embodiments of the present disclosure.
Figure 6:
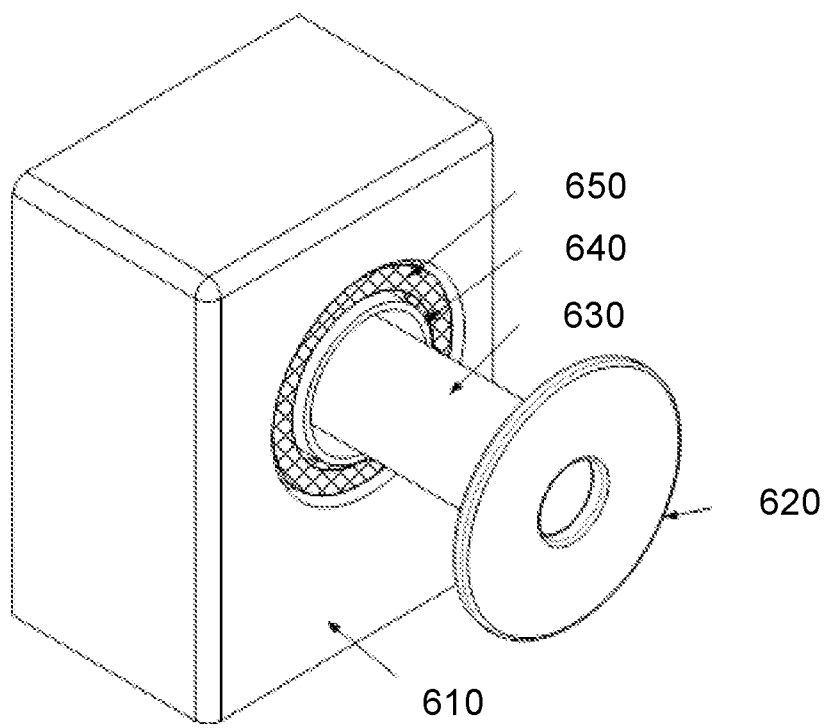
FIG. 6 is a schematic diagram illustrating an exemplary connection between a high-voltage connection assembly and a detection coil according to some embodiments of the present disclosure.
Figure 7:
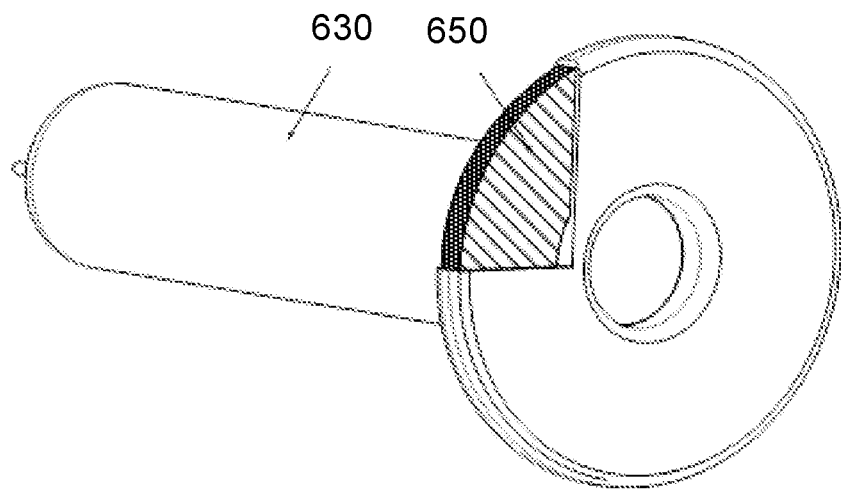
FIG. 7 is a schematic diagram illustrating an exemplary connection between a high-voltage connection assembly and a detection coil according to some embodiments of the present disclosure.

FIGS. 1A and 1B provide different views illustrating an exemplary detection coil according to some embodiments of the present disclosure. FIGS. 2A and 2B provide different views illustrating an exemplary detection coil according to some embodiments of the present disclosure. FIGS. 3A and 3B provide different views illustrating an exemplary detection coil according to some embodiments of the present disclosure. FIGS. 4A and 4B provide different views illustrating an exemplary detection coil according to some embodiments of the present disclosure. FIG. 5 is a schematic diagram illustrating an exemplary arcing detection device according to some embodiments of the present disclosure. FIG. 6 is a schematic diagram illustrating an exemplary connection between a high-voltage connection assembly and a detection coil according to some embodiments of the present disclosure. FIG. 7 is a schematic diagram illustrating an exemplary connection between a high-voltage connection assembly and a detection coil according to some embodiments of the present disclosure.

In some embodiments of the present disclosure, an arcing detection device may be provided. The arcing detection device may be configured to detect information of an arcing event of a system. For example, the information of the arcing event may include whether an arcing event occurs in the system, a position where an arcing event occurs in the system, whether an arcing event in the system is a small arcing event or a big arcing event, or the like, or any combination thereof. In some embodiments, the system may be applied in various scenarios involving a high-voltage power. For example, the system may include an X-ray system, a high-voltage dust removal system, a high-voltage dust mite removal system, a high-voltage disinfection system, a high-voltage water purification system, a high-voltage ozone processing system, etc. As used herein, an arcing event may refer to an abrupt electrical discharge that occurs when a sufficiently high electric field creates an ionized, electrically conductive channel through a normally-insulating medium, e.g., electrically insulating oil, an insulating material, air.

In some embodiments, the arcing detection device may include a detection coil and a processing circuit operably connected to the detection coil. The detection coil may be configured to detect a current variation (e.g., a current ramp) of the system. The processing circuit may be configured to determine the information of the arcing event of the system based on the current variation (e.g., a current ramp) of the system. In some embodiments, the detection coil or the processing circuit may process the current variation of the system, and then determine information of the arcing event based on the processed current variation. For example, the detection coil or the processing circuit may process the current variation by performing a noise reduction on a signal associated with the current variation including reducing noise in the signal. It should be noted the (processed) current variation may be represented by and/or quantified in terms of the (processed) signal (e.g., an electric signal) associated with the (processed) current variation, a (processed) current ramp, or a (processed) signal (e.g., an electric signal) associated with the (processed) current ramp.

In some embodiments, the detection coil may include a winding material (e.g., 110, 150, 310, or 330 in FIGS. 1A-4B) and a framework (e.g., 120 or 320 in FIGS. 1A, 1B, 3A, or 3B) configured to support the winding material. In some embodiments, the winding material may be made of a metallic material, e.g., copper, silver, gold, aluminum, zinc, or the like, or an alloy thereof. The framework may be made of an insulating material, e.g., epoxy plate, ceramics, glass, polyimide, polycarbonate, rubber, or the like, or any combination thereof, and insulated from the detection coil. In some embodiments, a first portion (e.g., 110 in FIGS. 1A-2B, 310 in FIGS. 3A-4B) of the winding material may be wound by multiple turns, e.g., in a clockwise direction or a counterclockwise direction. For example, the first portion of the winding material may be wound by multiple turns along a radial direction of the frame.

In some embodiments, a cross-section of the framework may be of an annular shape, a rectangular shape, a triangular shape, a pentagonal shape, a hexagonal shape, a trapezoidal shape, or the like, or any combination thereof. Taking the framework of the annular shape as an example, the framework may include an inner circle (e.g., 130 in FIG. 1A) and an outer circle (e.g., 140 in FIG. 1A). For each of the multiple turns, the winding material may first be wound on the outer circle and return to the outer circle through the inner circle, e.g., along the radial direction. In some embodiments, the first portion of the winding material may be evenly wound on the framework, thereby generating an even electric field. In some embodiments, if a cross-section of the framework has a shape other than the annular shape, the first portion of the winding material may be wound on the framework in a manner that an even electric field is generated. For example, a winding manner of the first portion of the winding material may be designed theoretically and then applied in the winding of a winding material on the framework. In some embodiments, the shape of the framework may be selected based on practical demands. In some embodiments, at least a portion (e.g., a high-voltage connection assembly in FIG. 6 or FIG. 7) of the system may be located in (e.g., a space defined by the inner circle thereof) the detection coil, such that the current variation (e.g., a current ramp) of the system may be detected by the detection coil. The shape of the framework may be selected to match with the at least a portion of the system.

In some embodiments, a second portion (e.g., 150 in FIG. 2A or FIG. 2B, 330 in FIG. 4A or FIG. 4B) of the winding material may be wound, e.g., on a central region of the framework, along a circumferential direction of the framework. The first portion and the second portion of the winding material may be arranged such that a coupling of a magnetic field (e.g., a magnetic field generated by an arcing event) with the first portion of the winding material may be decoupled by the second portion of the winding material; accordingly, an accuracy of the current variation (e.g., a current ramp) detected by the detection coil may be improved. In some embodiments, the second portion of the winding material may form an annulus (e.g., 150 in FIG. 2A or FIG. 2B, 330 FIG. 4A or FIG. 4B) defined by an inner circle (151 in FIG. 2A, 331 FIG. 4A or FIG. 4B) and an outer circle (152 in FIG. 2A, 332 FIG. 4A or FIG. 4B). A thickness (e.g., t in FIG. 4B) of the second portion (i.e., a difference between the radii of the inner circle and the outer circle of the annulus) may be set according to practical demands. In some embodiments, the larger the thickness is, the more effectively the second portion of the winding material decouples the coupling of the external magnetic field with the first portion of the winding material. Thus, the thickness may be set to be a relatively large value.

Taking the framework having a cross-section of an annular shape as an example, "the central region of the framework" used herein refers to a region substantially midway between the outer ring (140 in FIG. 1A) and the inner ring (130 in FIG. 1A) of the framework; that is, in a cross-sectional view, a centerline of the central region of the framework substantially coincides with a centerline of the framework. See, e.g., dotted circle 160 in FIG. 1B. "Substantially" used herein indicates that the deviation (e.g., the deviation of the centerline of the central region of the framework from the centerline of the framework) is below a threshold, e.g., 5%, 8%, 10%, etc. The centerline of the central region of the framework, in a cross-sectional view, may be the line from which the distance to the inner circle of the central region along the radial direction of the central region is the same as the distance to the outer circle of the central region along the radial direction of the central region. The centerline of the framework, in a cross-sectional view, may be the line from which the distance to the inner ring of the framework along the radial direction of the framework is the same as the distance to the outer ring of the framework along the radial direction of the framework. It should be noted that the above descriptions are for illustration purposes and non-limiting. For example, the second portion of the winding material may be wound on the central region of the framework along the circumferential direction of the framework by multiple turns. As another example, the second portion of the winding material may be wound, on a region of the framework other than the central region of the framework, along the circumferential direction of the framework.

In some embodiments, the first portion of the detection coil may be wound by the multiple turns from a first position (e.g., position a in FIG. 1A) of the framework to a second position (e.g., position b in FIG. 1A) of the framework. The second portion of the winding material may be wound, on the central region of the framework, from the second position to the first position along the circumferential direction of the framework. In some embodiments, the first position may be any position of the framework and the second position may be the same as or different from the first position. It should be noted the above descriptions may be for illustration purposes and non-limiting. For example, the first portion of the winding material may be first wound on the framework, and then the second portion of the winding material may be wound on the framework. As another example, the second portion of the winding material may be first wound, and then the first portion of the winding material may be wound on the framework.

In some embodiments, as described above, at least a portion of the system may be located in the space (e.g., dotted region 170 in FIG. 1B) defined by the inner circle (e.g., 130 in FIG. 1A) of the detection coil, such that the current variation (e.g., a current ramp) of the system may be detected by the detection coil. Assuming that the winding material is evenly distributed on the framework, if a deposited area of the winding material is relatively large (e.g., larger than 70%, 80%, 90% of the surface area of the framework), an accuracy of the current variation (e.g., a current ramp) of the system detected by the detection coil may remain substantially the same when the at least a portion of the system is located anywhere (e.g., an edge portion thereof, a central region) inside the space defined by the inner circle of the detection coil. If a deposited area of the winding material (e.g., lower than 30%, 40%, 50% of the surface area of the framework) is relatively small, the at least a portion of the system may need to be located in a central region of the space defined by the inner circle of the detection coil to ensure the accuracy of the current variation (e.g., a current ramp) of the system detected by the detection coil.

In some embodiments, the winding material may include a winding wire (e.g., 110 shown in FIG. 1A-2B), a winding laying (e.g., 310 shown in FIG. 3A-4B), etc. Since an area of the framework covered by a turn of the winding laying may be larger than an area of the framework covered by a turn of the winding wire, to achieve a same or similar surface area coverage on the framework, a first count of the turns of the winding laying wound on the framework may be configured smaller than a second count of the turns of the winding wire; accordingly, a winding of the winding laying may be simplifier than a winding of the winding wire. For example, the first count may be 80%-90% of the second count. Besides, the smaller the count of the turns of the winding material wound on the framework, the smaller the error rate caused by the winding may be, and the more accurate the winding may be. Thus, an accurate current variation (e.g., a current ramp) may be more easily to be achieved by utilizing the winding laying compared to the winding wire. It should be noted that the above descriptions are for illustration purposes and non-limiting. For example, the first count or the second count may be set according to practical demands.

In some embodiments, the detection coil may include a Rogowski coil, also referred to as an air-core transformer or a magnetometer. The Rogowski coil may be an air-core coil with a specific structure. The Rogowski coil has been widely used as an induction coil of a current transformer or a sensor head of an electric current detection device. The Rogowski coil may exhibit properties including, e.g., a relatively high linearity between an output electric current or an output current variation and an electric current to be detected or a current variation to be detected, a relatively wide dynamic range of electric current or current variation measurement, having no core saturation, desirable insulation of a signal outputted by the Rogowski coil from external interference, a simple structure, a low insertion loss, etc. A winding material of the Rogowski coil may be evenly wound on the framework. The framework may have a cross-section of an annular shape. The framework may be insulated from the winding material. The Rogowski coil may be wrapped around at least a portion of the system, e.g., a conductor, (e.g., a high-voltage connection assembly in FIG. 6 or FIG. 7) to detect a current variation (e.g., a current ramp) or an electric current flowing through the conductor. In some embodiments, a parameter indicating the electric current or a parameter (e.g., a current ramp) indicating the current variation of the conductor may be determined by detecting a magnetic flux through a hollow coil on a closed loop around the conductor at leads (e.g., 111, 112 in FIG. 1) of the Rogowski coil, or a change of the magnetic flux, etc. When the electric current of the conductor flows through the Rogowski coil, a voltage may be induced in the Rogowski coil. The induced voltage may be determined according to Equation (1) below:

$$v_{coil}(t) = M\frac{di(t)}{dt}, \qquad (1)$$

where t represents a time point, $v_{coil}(t)$ represents the induced voltage at the time point t, M represents a mutual inductance between the Rogowski coil and the conductor, i (t) represents the electric current of the conductor at the time point t, and $$\frac{di(t)}{dt}$$

may represent the current variation (e.g., the current ramp) of the conductor.

In some embodiments, the winding material, e.g., of the Rogowski coil, may be wound manually, by a winding machine, etc. In some embodiments, the winding material of the Rogowski coil may be integrated in a printed circuit board (PCB), and the Rogowski coil accordingly may also be referred to as a Rogowski coil based on PCB. For example, the Rogowski coil based on PCB may include a planar Rogowski coil (PRC) based on PCB and a combined Rogowski coil (CRC) based on PCB. In some embodiments, the Rogowski coil based on PCB may be relatively light and/or thin, and the winding material thereof may be wound evenly. In addition, a symmetry of the Rogowski based on PCB may be good and an accuracy of a signal detected by the Rogowski based on PCB may be improved.

In some embodiments, the processing circuit (e.g., 520 in FIG. 5) may include a transformer (e.g., 521 in FIG. 5), a comparison circuit (e.g., 522 in FIG. 5), one or more latches (e.g., a latch 525, a latch 526 in FIG. 5), a controller (e.g., 527 in FIG. 5), etc. In some embodiments, a first end of the transformer may be operably connected to the detection coil (e.g., 510 in FIG. 5), and a second end of the transformer may be operably connected to the comparison circuit. The transformer may be configured to insulate the signal associated with the current variation from a magnetic field and/or an electric field generated by the arcing event of the system and transmit the signal to the comparison circuit, such that an accuracy of the arcing detection based on the insulated signal may be improved.

In some embodiments, the comparison circuit may be configured to generate a comparison result by comparing the current variation (e.g., a current ramp) of the system with one or more current variation thresholds, and determine the information of the arcing event of the system based on the comparison result. In some embodiments, the comparison circuit may include one or more comparators (e.g., a comparator 523, a comparator 524 in FIG. 5), each of which may correspond to one of the one or more current variation thresholds. The one or more current variation thresholds may be different from each other. In some embodiments, each of the one or more comparators may be operably connected to one of the one or more latches.

In some embodiments, the detection coil may transmit the current variation (e.g., a current ramp) to the processing circuit (e.g., an input end thereof). The processing circuit may transmit the current variation to each of at least one of the one or more comparators, respectively. The comparison result generated by the one or more comparators may be transmitted to the controller via the one or more latches. The controller may be configured to determine the information of the arcing event in the system based on the comparison result.

In some embodiments, the one or more comparators may include a first comparator (e.g., the comparator 523 in FIG. 5) of a first current variation threshold and a second comparator (e.g., the comparator 524 in FIG. 5) of a second current variation threshold. The first comparator and the second comparator may be configured to compare the current variation (e.g., a current ramp) with the first current variation threshold and the second current variation threshold, respectively. The first current variation threshold may be lower than the second current variation threshold. In response to determining that the current variation is higher than the first current variation threshold and lower than the second current variation threshold, the comparison circuit may determine that the small arcing event occurs in the system. In response to determining that the current variation is higher than the second current variation threshold, the comparison circuit may determine that the big arcing event occurs in the system. In some embodiments, the second current variation threshold may be designated as 100%. The first current variation threshold may be within a range from 0 to 50%. The second current variation threshold may be within a range from 50% to 100%. It should be noted the above descriptions are for illustration purposes and non-limiting. A count of the one or more comparators may be more than two, for example, 3, 4, 5, etc., and set according to practical demands. The more the count of the one or more comparators, the more finely a strength level (e.g., small, medium, big) of the arcing event may be determined. For example, the first current variation threshold may be within a range from 0 to 20%, and a current variation threshold corresponding to a medium arcing event may be from 20% to 50%.

As described above, the current variation may be represented by and/or quantified in terms of the signal (e.g., the electric signal) associated with the current variation, a current ramp, or a signal associated with the current ramp. Merely by way of example, the signal may represent the magnitude of the current variation or the current ramp. The comparing the current variation with the one or more current variation thresholds may also be referred to a comparing an intensity of the signal associated with the current variation or the signal associated with the current ramp with one or more signal intensities thresholds associated with the one or more current variation thresholds.

In some embodiments, the arcing detection device may include a casing (e.g., a casing 610 in FIG. 6) configured to accommodate the detection coil and/or insulate the detection coil from an external environment of the casing. For example, the casing may be configured to insulate the detection coil from the magnetic field or the electric field generated by the arcing event of the system. In some embodiments, the casing may be electrically connected to ground or earth. In some embodiments, the casing may be made of a metallic material, for example, e.g., copper, silver, gold, aluminum, zinc, or the like, or an alloy thereof. It should be noted that the above descriptions are for illustration purposes and non-limiting. In some embodiments, the processing circuit of the arcing detection device may also be accommodated in the casing.

In some embodiments, the detection coil may be operably connected to a high-voltage connection assembly configured to operably connect the detection coil to the system. The high-voltage connection assembly may include a flange (e.g., 620 in FIG. 6), a plug (e.g., 630 in FIG. 6), a socket (e.g., 640 in FIG. 6), etc. In some embodiments, the plug may be located in the detection coil (e.g., 650 in FIG. 6). The plug may match with the socket. The socket may be operably connected to the flange. The detection coil may be operably connected to the system by inserting the plug into the socket. For example, the plug may be inserted into the socket, and the flange may be fixed on a wall of a high-voltage tank of the X-ray system, such that the detection coil may be fixed on the wall of the high-voltage tank of the X-ray system.

In some embodiments, the detection coil may be integrated in the plug (e.g., shown in FIG. 7), e.g., while the high-voltage connection assembly is manufactured. For example, the detection coil may be integrated at a surface of the plug which operably connects to the flange. By directly connecting the high-voltage connection assembly to the system, the detection coil may be operably connected to the system, thereby simplifying the assembly of the detection coil and the system. In some embodiments, the Rogowski coil based on PCB may be selected as the detection coil since a size of the Rogowski coil based on PCB may be relatively small. It is understood that when a component is referred to as being "integrated in" another component used herein, it may be directly on, connected or coupled to, or communicate with the another component, or an intervening component may be present, unless the context clearly indicates otherwise. It should be noted that the above descriptions are for illustration purposes and non-limiting. In some embodiments, the processing circuit of the arcing detection device may also be integrated in the high-voltage connection assembly.

Figure 8A:
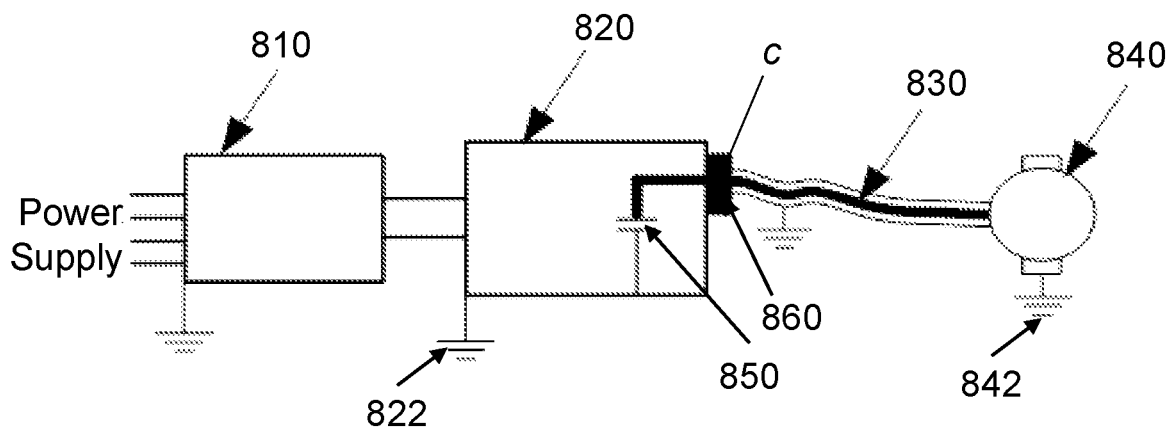
FIGS. 8A-8C are schematic diagrams illustrating exemplary X-ray systems according to some embodiments of the present disclosure.
Figure 8B:
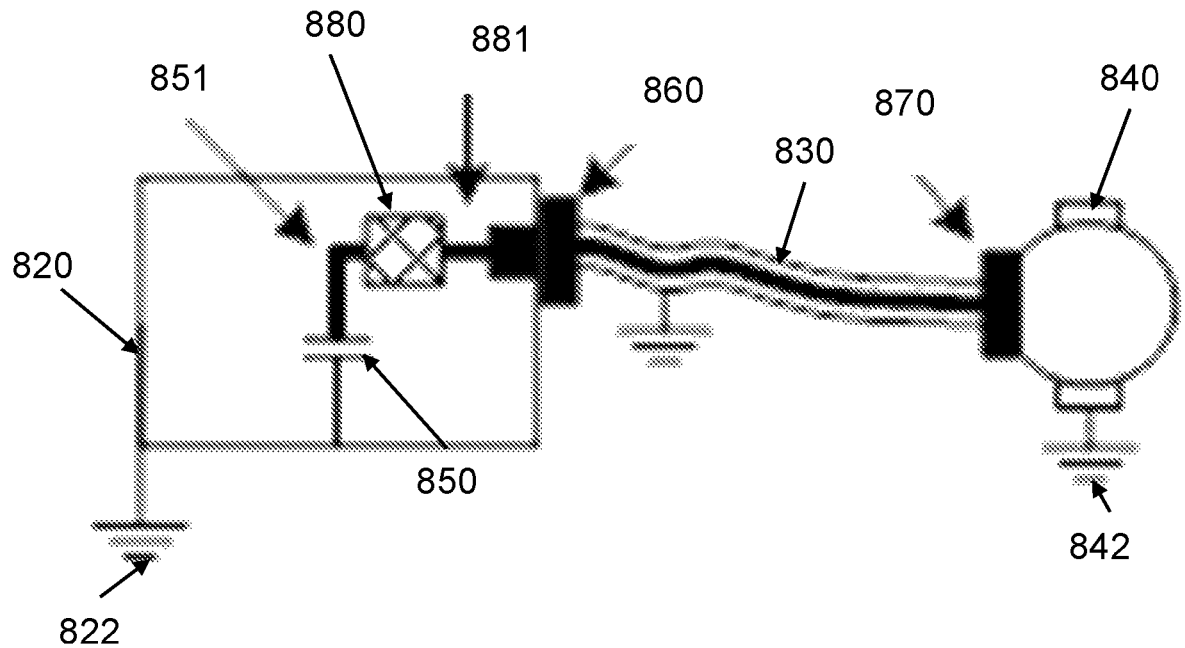
Figure 8C:
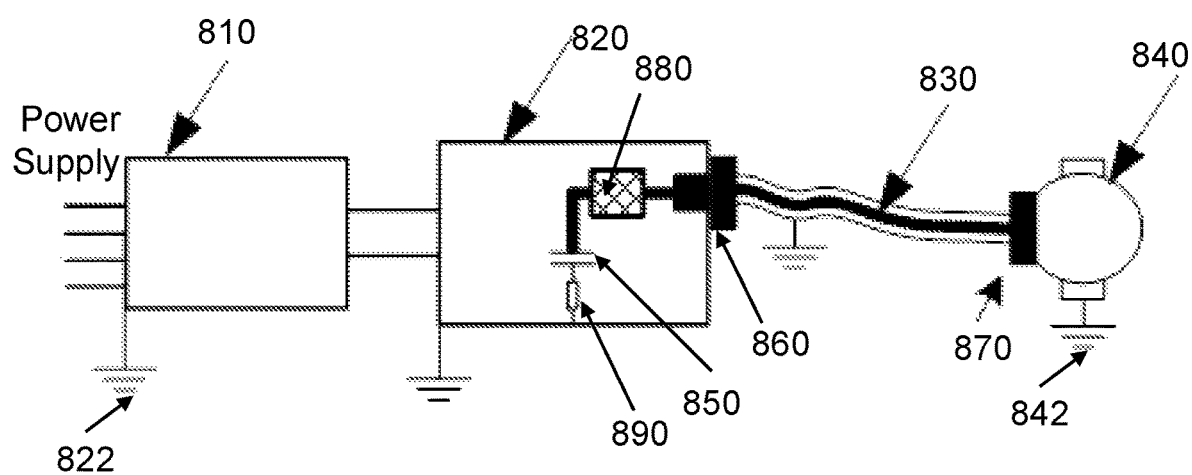

FIGS. 8A-8C are schematic diagrams illustrating exemplary X-ray systems according to some embodiments of the present disclosure.

In some embodiments, the system may include the X-ray system. The X-ray system may include an inverter (e.g., 810 in FIGS. 8A-8C), a high-voltage tank (e.g., 820 in FIGS. 8A-8C), a high-voltage cable (e.g., 830 in FIGS. 8A-8C), and an X-ray tube (e.g., 80 in FIGS. 8A-8C), e.g., operably connected in sequence (e.g., shown in FIG. 8A, 8B, or 8C). In some embodiments, the X-ray tube may be configured to emit an X-ray beam. The X-ray beam may be generated by electrons of a relatively high speed impinging on a metallic target. In some embodiments, a high-voltage generator of the system may include the inverter and the high-voltage tank. The high-voltage generator may be configured to provide a high-voltage to the X-ray tube. In some embodiments, the inverter may be operably connected to a power supply (e.g., a battery, a mains supply) and configured to transform a direct current (DC) signal (e.g., a DC voltage) obtained from the power supply into an alternating current (AC) signal (e.g., an AC voltage). The AC signal may be transmitted to the high-voltage tank. Accordingly, the high-voltage tank may be configured to generate the high voltage. The high voltage may be applied to the X-ray tube to provide power to the X-ray tube. The high-voltage generator and the X-ray tube may be two independent components and operably connected via the high-voltage cable, providing the high voltage to the X-ray tube. In some embodiments, the high-voltage tank may include a filter capacitor (e.g., 850 in FIG. 8A, 8B, or 8C) and a first high-voltage connection assembly (e.g., 860 in FIG. 8A, 8B, or 8C). The filter capacitor may be configured to make the high voltage outputted by the high-voltage tank remain within a range, thereby avoiding a relatively large fluctuation of the outputted voltage. The first high-voltage connection assembly may be configured to operably connect the high-voltage tank to the high-voltage cable.

In some embodiments, the detection coil may be located between the high-voltage tank and the X-ray tube. For example, the detection coil may be located at a contact surface where the first high-voltage connection assembly (e.g., 860 in FIG. 8A) contact the high-voltage tank, a lead (e.g., 851 in FIG. 8B) of the filter capacitor, a lead (e.g., 881 in FIG. 8B) of an arcing suppression unit (e.g., 880 in FIG. 8B or FIG. 8C) of the X-ray system, the high-voltage cable, a second high-voltage connection assembly (e.g., 870 in FIG. 8B or FIG. 8C) of the X-ray tube, or the like, or any combination thereof. In some embodiments, the arcing event suppression unit may be configured to absorb and discharge at least a portion of the energy released in an arcing event in the X-ray system. In some embodiments, the X-ray system may include one or more detection coils, each of which may be the same as or similar to the detection coil (e.g., the detection coil in FIGS. 1A-4B) described above. For example, the one or more detection coils may include a first detection coil operably connected to the first high-voltage connection assembly (e.g., located at the contact surface where the high-voltage connection assembly contact the high-voltage tank), a second detection coil located at the second high-voltage connection assembly of the X-ray tube, a third detection coil located at the lead of the arcing suppression unit, a fourth detection coil located at the lead of the filter capacitor, etc. If an arcing event is determined to occur in the system based on a current variation (e.g., a current ramp) detected by a detection coil at a specific position, a signal associated with the current variation detected by the detection coil may also be referred to as an arcing signal.

In some embodiments, when an arcing event occurs in the X-ray tube, energy generated in the arcing event may be released through the high-voltage cable, or through a wire of the X-ray tube operably connected to ground or earth (842 in FIG. 8A, 8B, or 8C). When an arcing event occurs in the high-voltage tank, energy generated in the arcing event may be released not through the high-voltage cable, but through, e.g., a wire of the high-voltage tank operably connected to ground or earth (e.g., 822 in FIG. 8A). In some embodiments, the X-ray system may only include the first detection coil located at the contact surface where the high-voltage connection assembly contact the high-voltage tank. In some embodiments, if a signal associated with a current variation (e.g., a current ramp) detected by the first detection coil is an arcing signal, the arcing event may be determined to occur in the X-ray tube or the high-voltage cable. If the arcing event occurs in the high-voltage cable, the arcing event may be observed by an operator of the system. Therefore, whether the arcing event occurs in the X-ray tube may be determined.

In some embodiments, the X-ray system may include the first detection coil located at the contact surface where the high-voltage connection assembly contact the high-voltage tank and the second detection coil located at the second high-voltage connection assembly of the X-ray tube. Merely by way of example, if the signal associated with the current variation detected by the first detection coil is an arcing signal and a signal associated with the current variation detected by the second detection coil is not an arcing signal, the arcing event may be determined to occur in the high-voltage cable.

In some embodiments, the X-ray system may include only the second detection coil located at the second high-voltage connection assembly of the X-ray tube. In some embodiments, if the signal associated with the current variation (e.g., a current ramp) detected by the second detection coil is an arcing signal, the arcing event may be determined to occur in the X-ray tube.

In some embodiments, the X-ray system may include the first detection coil located at the contact surface where the high-voltage connection assembly contact the high-voltage tank and the third detection coil located at the lead of the arcing suppression unit. In some embodiments, if a signal associated with the current variation (e.g., a current ramp) detected by the third detection coil is an arcing signal and the signal associated with the current variation detected by the first detection coil is not an arcing signal, the arcing event may be determined to occur in the first high-voltage assembly of the high-voltage tank.

In some embodiments, the X-ray system may include the third detection coil located at the lead of the arcing suppression unit and the fourth detection coil located at the lead of the filter capacitor. In some embodiments, if a signal associated with the current variation (e.g., a current ramp) detected by the fourth detection coil is an arcing signal and the signal associated with the current variation detected by the third detection coil is not an arcing signal, the arcing event may be determined to occur in the arcing suppression unit.

In some embodiments, the X-ray system (e.g., the high-voltage tank thereof) may include a current detection unit (e.g., a resistance, an electric current detector) (e.g., 890 in FIG. 8C) operably connected to the filter capacitor. The current detection unit may be configured to determine whether the arcing event occurs in the first high-voltage connection assembly of the high-voltage tank when the arcing event occurs in the high-voltage tank. In practice, if an arcing event occurs in the first high-voltage connection assembly, at least a portion of energy generated in the arcing event may be absorbed by the arcing suppression unit; if an arcing event occurs elsewhere in the high-voltage tank, the arcing suppression unit may fail to absorb at least a portion of energy generated in the arcing event since the energy does not flow through the arcing suppression unit.

Accordingly, if an electric current detected by the current detection unit is larger than a first current threshold (e.g., an electric current detected by the current detection unit when there is no arcing event in the high-voltage tank) and smaller than a second current threshold (e.g. a minimum electric current detected by the current detection unit when there is an arcing event in the high-voltage tank and the arcing suppression unit fails to absorb at least a portion of energy generated in the arcing event), the arcing event may be determined to occur in the first high-voltage connection assembly of the high-voltage tank. If the electric current is larger than the second current threshold, the arcing event may be determined to occur elsewhere in the high-voltage tank other than the first high-voltage connection assembly of the high-voltage tank.

It should be noted that the above descriptions are for illustration purposes and non-limiting. In some embodiments, the processing circuit of the arcing detection device may also be located between the high-voltage tank and the X-ray tube together with the detection coil of the arcing detection device.

Figure 10:
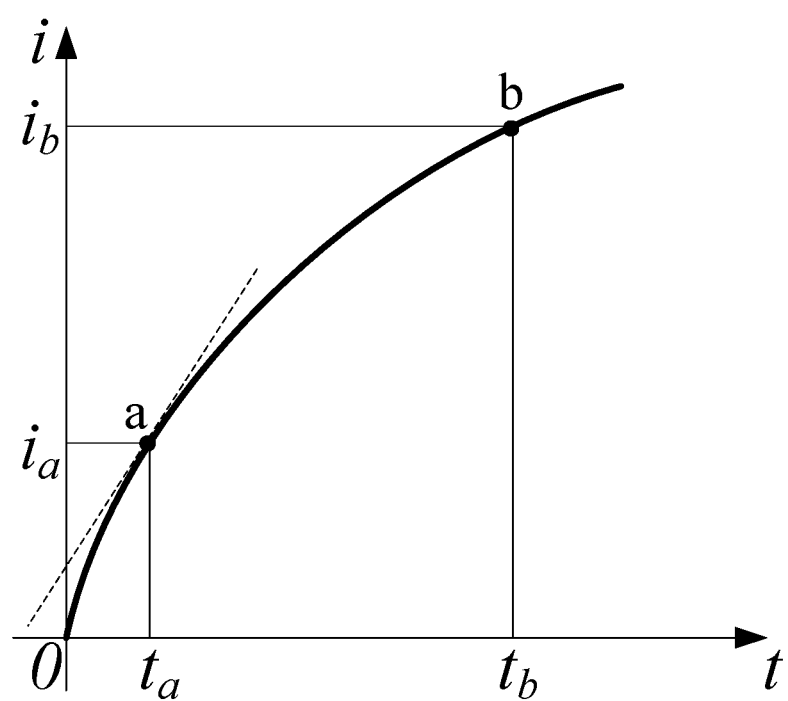
FIG. 10 is a curve illustrating an exemplary change of electric currents over time according to some embodiments of the present disclosure.

FIG. 9 is a flowchart illustrating an exemplary arcing detection process according to some embodiments of the present disclosure. FIG. 10 is a curve illustrating an exemplary change of electric currents over time according to some embodiments of the present disclosure.

In 910, a signal associated with a first current variation (e.g., a current ramp) of a system may be obtained. For example, the system may include an X-ray system, a high-voltage dust removal system, a high-voltage dust mite removal system, a high-voltage disinfection system, a high-voltage water purification system, a high-voltage ozone processing system, etc. In some embodiments, a detection coil of an arcing detection device operably connected to the system may obtain the signal associated with the first current variation.

In 920, a second current variation (also referred to as a processed current variation) (e.g., a current ramp) of the system may be determined based on the signal associated with the first current variation. In some embodiments, the second current variation may be determined by performing a noise reduction operation on the signal associated with the first current variation including reducing noise in the signal. In some embodiments, the detection coil or a processing circuit of the arcing detection device may determine the second current variation. More descriptions of the detection coil, the arcing detection device, the processing circuit, the system, the first current variation, and/or the second current variation may be found elsewhere in the present disclosure, for example, FIGS. 1-8C or the descriptions thereof.

In 930, information an arcing event of the system may be determined based on the second current variation (e.g., a current ramp) of the system. For example, the information of the arcing event may include whether an arcing event occurs in the system, a position where an arcing event occurs in the system, whether an arcing event in the system is a small arcing event or a big arcing event, or the like, or any combination thereof. In some embodiments, the information of the arcing event of the system may be determined by comparing the second current variation with one or more current variations. For example, the one or more current variation thresholds may include a first current variation threshold and a second current variation threshold higher than the first current variation threshold.

In some embodiments, in response to determining that the second current variation is higher than the first current variation threshold, the arcing event may be determined to occur in the system. In some embodiments, in response to determining that the second current variation is higher than the first current variation threshold and lower than the second current variation threshold, the small arcing event may be determined to occur in the system. In some embodiments, in response to determining that the current variation is higher than the second current variation threshold, the big arcing event may be determined to exist in the system. More descriptions of the one or more current variation thresholds, the first current variation threshold, or the second current variation threshold may be found elsewhere in the present disclosure, for example, FIGS. 1-7.

In some embodiments, the second current variation may be represented by and/or quantified in terms of a second signal (e.g., an electric signal) associated with the second current variation, a second current ramp, or a second signal associated with the second current ramp. Merely by way of example, the second signal may represent the magnitude of the second current variation or the second current ramp. The comparing the second current variation with the one or more current variation thresholds may also be referred to a comparing an intensity of the second signal associated with the second current variation or the second signal associated with the second current ramp with one or more signal intensities thresholds associated with the one or more current variation thresholds. More descriptions of the position of the arcing event of the system may be found elsewhere in the present disclosure, for example, FIGS. 8A-8C or the descriptions thereof.

During a specific arcing event in a specific system, an electric current of the specific system may increase continuously and then reach a stable value. A current variation (e.g., a current ramp) of an existing system may be first determined, and then an electric current of the existing system may be determined by performing massive filtering operations (e.g., an integration operation) on the current variation. Further, whether an arcing event occurs in the existing system, whether an arcing event of the existing system is the small arcing event or the big arcing event, etc., may be determined based on the electric current, which may be time-consuming. The existing system may also need time to respond to the arcing event (e.g., inform an operator of the existing system of the arcing event, shut down the system), during which the electric current may increase to a much higher value (e.g., the stable value), causing damage to the existing system.

Some embodiments of the present disclosure may directly utilize the current variation (e.g., a current ramp) to perform the arcing detection without performing the integration operation, which may be quicker compared to the existing system utilizing the electric current. The current variation may indicate a change of an electric current of the system. The arcing event of the system can be detected when the electric current of the system is relatively low (e.g., lower than the stable value) (e.g., at an early stage of an arcing event), increasing the speed of the arcing detection compared to detecting the arcing event utilizing the electric current and further improving the security of the system. For example, as shown in FIG. 10, an arcing event in the existing system is detected when an electric current of the existing system is b at a time point tp, and an arcing event in the system is detected when an electric current of the system is a lower than b at a time point ta earlier than the time point tp.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the order in the operations of the process 900 as illustrated in FIG. 9 is not intended to be limiting, and the operations may be implemented in a different order.

It should be noted that the above descriptions are for illustration purposes and non-limiting. In some embodiments, an electric current of a system may be detected by a detection coil (the detection coil in FIGS. 1-10), and then information of an arcing event of the system may be determined based on the electric current of the system. For example, the information of the arcing event may include whether an arcing event occurs in the system, a position where an arcing event occurs in the system, whether an arcing event in the system is a small arcing event or a big arcing event, or the like, or any combination thereof.

Figure 11:
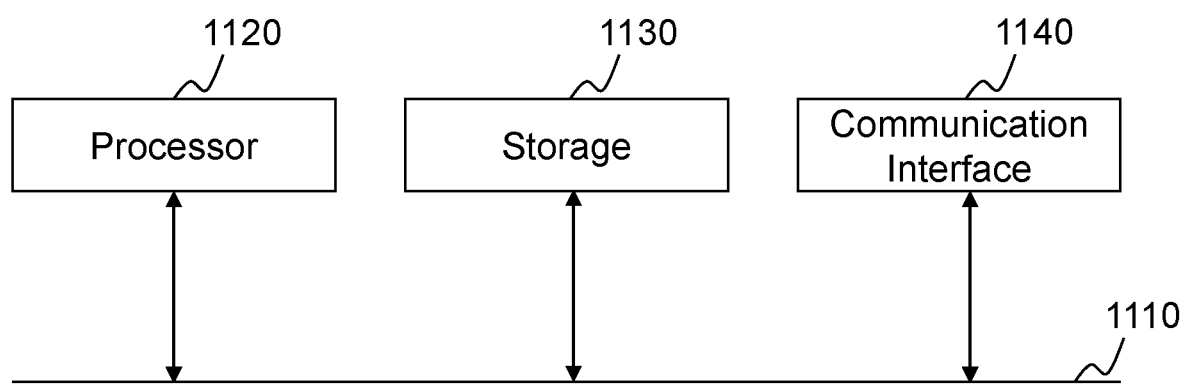
FIG. 11 is a schematic diagram illustrating exemplary hardware of an exemplary computing device according to some embodiment of the present disclosure.

In some embodiments, an arcing detection process (e.g., the process 900) may be executed in a computing device including a set of computer-executable instructions. FIG. 11 is a schematic diagram illustrating exemplary hardware of an exemplary computing device according to some embodiment of the present disclosure.

In some embodiments, the computing device 1100 may include a processor 1120 and a storage 1130. The storage 1130 may be configured to store or cache various data files that need to be processed and/or used for communication, computer program instructions executed by the processor 1120, etc. The processor 1120 may be configured to read and execute the computer program instructions stored in the storage 1130 to implement the arcing detection process described above.

For example, the processor 1120 may include a central processing unit (CPU), a specific integrated circuit (e.g., an application-specific integrated circuit (ASIC)), or one or more integrated circuits capable of implementing the embodiments of the present disclosure. In some embodiments, the storage 1130 may include a mass storage for data or instructions. Merely by way of example, the storage 1130 may include a hard disk drive (HDD), a floppy disk drive, a solid-state drive (SSD), a flash memory, an optical disk, a magneto-optical disk, a magnetic tape, a universal serial bus (USB) drive, or the like, or any combination thereof. In some embodiments, the storage 1130 may include a removable or non-removable (or fixed) storage. In some embodiments, the storage 1130 may be internal or external to a data processing device. For example, the storage 1130 may include a non-volatile memory. As another example, the storage 1130 may include a read-only memory (ROM), a random access memory (RAM), etc. Exemplary ROM may include a mask ROM, a programmable ROM (PROM), an erasable programmable ROM (EPROM), an electrically erasable programmable ROM (EEPROM), an electrically alterable ROM (EAROM), a flash memory, or the like, or any combination thereof. In some embodiments, the RAM may include a static random-access memory (SRAM), a dynamic random access memory (DRAM), etc. Exemplary DRAM may include a fast page mode DRAM (FPM DRAM), an extended data out DRAM (e.g., EDO DRAM), a synchronous DRAM (e.g., SDRAM), or the like, or any combination thereof.

In some embodiments, the computing device 1100 may also include a communication interface 1140 and a bus 1110. As shown in FIG. 11, the processor 1120, the storage 1130, and the communication interface 1140 may be connected and communicated through the bus 1110.

The communication interface 1140 may be configured to implement communication between various modules, devices, units, and/or devices in the embodiments of the present disclosure. The communication interface 1140 may also be configured to implement data communication with other components such as an external device (e.g., an external storage), a database, etc.

The bus 1110 may include hardware or software and configured to couple the components of the computing device 1100. In some embodiments, the bus 1110 may include a data bus, an address bus, a control bus, an expansion bus, a local bus, etc. For example, the bus 1110 may include an accelerated graphics port (AGP) or other graphics buses, an enhanced industry standard architecture (EISA) bus, a front-side bus (FSB), a hyper transport (HT) interconnection, an industry-standard architecture (ISA) bus, a wireless bandwidth interconnection, a low pin count (LPC) bus, a memory bus, a micro channel architecture (MCA) bus, a peripheral component interconnect (PCI) bus, a PCI-express (PCI-X) bus, a serial advanced technology attachment (SATA) bus, a video electronics standards association local bus (VLB) bus, or other suitable buses, or any combination thereof. In some embodiments, the bus 1110 may include one or more buses. Although the embodiments of the present disclosure describe and show a specific bus, any suitable bus or interconnection may be suitable for the present disclosure.

In some embodiments of the present disclosure, a computer-readable storage medium configured to implement the arcing detection process may be provided. The computer-readable storage medium may store computer program instructions. When the computer program instructions are executed by a processor (e.g., the processor 1120), the arcing detection process may be performed.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate+1%, +5%, +10%, or +20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. An arcing detection device, comprising:
    a detection coil configured to detect a current variation of a system; and
    a processing circuit operably connected to the detection coil, wherein
        the system is an X-ray system that includes an X-ray tube configured to emit an X-ray beam, a high-voltage tank configured to generate a high voltage, and a high-voltage cable operably connecting the high-voltage tank to the X-ray tube, the high voltage is applied to the X-ray tube to provide power to the X-ray tube,
        the processing circuit is configured to determine information of an arcing event of the system based on the current variation of the system, the information of the arcing event of the system comprising a position where the arcing event occurs in the system, the position is located at one of the X-ray tube, the high-voltage tank, and the high-voltage cable.

2. The arcing detection device of claim 1, wherein the processing circuit includes a comparison circuit,
    the comparison circuit includes one or more comparators each of which corresponds to one of one or more current variation thresholds, each of the one or more comparators being configured to generate a comparison result by comparing the current variation with the corresponding current variation threshold,
    the comparison circuit is configured to determine a strength level of the arcing event based on the comparisons results generated by the one or more comparators.

3. The arcing detection device of claim 2, wherein the one or more comparators include a first comparator of a first current variation threshold and a second comparator of a second current variation threshold;
    the first comparator and the second comparator are configured to compare the current variation with the first current variation threshold and the second current variation threshold, respectively, the first current variation threshold being lower than the second current variation threshold;
    in response to determining that the current variation is higher than the first current variation threshold and lower than the second current variation threshold, the comparison circuit determines that a small arcing event occurs in the system; and
    in response to determining that the current variation is higher than the second current variation threshold, the comparison circuit determines that a big arcing event occurs in the system.

4. The arcing detection device of claim 2, wherein the processing circuit includes a transformer, a first end of which is operably connected to the detection coil, and a second end of which is operably connected to the comparison circuit; and
    the transformer is configured to insulate a signal associated with the current variation from a magnetic field generated by the arcing event of the system and transmit the signal to the comparison circuit.

5. The arcing detection device of claim 1, wherein the detection coil is operably connected to a high-voltage connection assembly configured to operably connect the detection coil to the system; and
    the high-voltage connection assembly includes at least one of a plug, a socket, or a flange.

6. The arcing detection device of claim 1, wherein the detection coil is located between the high-voltage tank and the X-ray tube.

7. The arcing detection device of claim 6, wherein the detection coil is located at one of:
    a contact surface between the high-voltage tank and a high-voltage connection assembly of the high-voltage tank,
    a lead of a filter capacitor,
    a lead of an arcing suppression unit of the X-ray system,
    a high-voltage cable operably connecting the high-voltage tank and the X-ray tube, and
    a high-voltage connection assembly of the X-ray tube.

8. The arcing detection device of claim 1, wherein the high-voltage tank comprises a high-voltage connection assembly configured to operably connect the detection coil to the X-ray system; and
    in response to determining that the arcing event occurs in the system based on the current variation detected by the detection coil, the arcing event is determined to occur in the X-ray tube or a high-voltage cable operably connecting the high-voltage tank and the X-ray tube.

9. The arcing detection device of claim 1, wherein the X-ray tube includes a high-voltage connection assembly configured to operably connect the detection coil to the X-ray system; and
    in response to determining that the arcing event occurs in the system based on the current variation detected by the detection coil, the arcing event is determined to occur in the X-ray tube.

10. The arcing detection device of claim 1, wherein the detection coil includes a first detection coil located at a high-voltage connection assembly of the high-voltage tank and a second detection coil located at a high-voltage connection assembly of the X-ray tube; and
    in response to determining that the arcing event occurs in the system based on a current variation detected by the first detection coil and no arcing event occurs in the system based on a current variation detected by the second detection coil, the arcing event is determined to occur in a high-voltage cable that operably connects the high-voltage tank and the X-ray tube.

11. The arcing detection device of claim 1, wherein
the detection coil includes a first detection coil located at a high-voltage connection assembly of the high-voltage tank and a second detection coil located at a lead of an arcing suppression unit of the high-voltage tank; and
in response to determining that the arcing event occurs in the system based on a current variation detected by the second detection coil and no arcing event occurs in the system based on a current variation detected by the first detection coil, the arcing event is determined to occur in the high-voltage connection assembly of the high-voltage tank.

12. The arcing detection device of claim 1, wherein
the detection coil includes a first detection coil located at a lead of an arcing suppression unit of the high-voltage tank and a second detection coil located at a lead of a filter capacitor of the high-voltage tank; and
in response to determining that the arcing event occurs in the system based on a current variation detected by the second detection coil and no arcing event occurs in the system based on a current variation detected by the first detection coil, the arcing event is determined to occur in the arcing suppression unit of the high-voltage tank.

13. The arcing detection device of claim 1, wherein the detection coil includes a plurality of detection coils arranged at different positions in the X-ray system and configured to detect current variations at the different positions.

14. An arcing detection device, comprising:
a detection coil configured to detect a current variation of a system; and
a processing circuit operably connected to the detection coil and configured to determine information of an arcing event of the system based on the current variation of the system, wherein:
the detection coil includes a winding material and a framework configured to support the winding material,
the winding material includes a first portion wound around the framework along a radial direction of the framework and a second portion wound around the framework along a circumferential direction of the framework wherein winding manners of the first portion and the second portion around the framework are different.

15. The arcing detection device of claim 14, wherein the first portion of the winding material is wound, by multiple turns, from a first position of the framework to a second position of the framework along the radial direction.

16. The arcing detection device of claim 14, wherein the system is an X-ray system that includes an X-ray tube configured to emit an X-ray beam and a high-voltage tank configured to generate a high voltage, the high voltage is applied to the X-ray tube to provide power to the X-ray tube, and the detection coil is located between the high-voltage tank and the X-ray tube.

17. The arcing detection device of claim 14, wherein the processing circuit includes a comparison circuit,
the comparison circuit includes one or more comparators each of which corresponds to one of one or more current variation thresholds, each of the one or more comparators being configured to generate a comparison result by comparing the current variation with the corresponding current variation threshold,
the comparison circuit is configured to determine a strength level of the arcing event based on the comparisons results generated by the one or more comparators.

18. The arcing detection device of claim 14, wherein the second portion of the winding material is wound, by multiple turns along the circumferential direction of the framework, on a central region of the framework.

19. The arcing detection device of claim 18, wherein the framework has a cross-section of an annular shape formed by an outer ring and an inner ring, and the central region of the framework is midway between the outer ring and the inner ring.

20. The acing detection device of claim 18, wherein the framework forms a bore, the second portion of the winding material is wound by multiple turns along the circumferential direction of the framework, each of the multiple turns is coaxial with the bore.

* * * * *